(12) United States Patent
Angermann et al.

(10) Patent No.: US 10,468,575 B2
(45) Date of Patent: Nov. 5, 2019

(54) THERMOELECTRIC MODULE

(71) Applicant: Mahle Behr GmbH & Co. KG, Stuttgart (DE)

(72) Inventors: Hans-Heinrich Angermann, Stuttgart (DE); Tobias Fuchs, Boeblingen (DE); Thomas Himmer, Reichenbach (DE); Volker Schall, Hemmingen (DE)

(73) Assignee: Mahle Behr GmbH & Co. KG (DE)

( * ) Notice: Subject to any disclaimer, the term of this patent is extended or adjusted under 35 U.S.C. 154(b) by 759 days.

(21) Appl. No.: 14/184,696

(22) Filed: Feb. 19, 2014

(65) Prior Publication Data

US 2014/0230875 A1  Aug. 21, 2014

(30) Foreign Application Priority Data

Feb. 20, 2013 (DE) ......................... 10 2013 202 785

(51) Int. Cl.
*H01L 35/34* (2006.01)
*H01L 35/28* (2006.01)
*H01L 35/32* (2006.01)

(52) U.S. Cl.
CPC .............. *H01L 35/28* (2013.01); *H01L 35/32* (2013.01); *H01L 35/34* (2013.01); *Y10T 29/49885* (2015.01); *Y10T 29/49968* (2015.01)

(58) Field of Classification Search
CPC .......... H01L 35/28; H01L 35/34; H01L 35/32
See application file for complete search history.

(56) References Cited

U.S. PATENT DOCUMENTS

| | | | |
|---|---|---|---|
| 3,056,848 A | 10/1962 | Meyers | |
| 3,075,030 A | 1/1963 | Elm et al. | |
| 3,225,549 A | 12/1965 | Elfving | |
| 5,441,576 A * | 8/1995 | Bierschenk | H01L 35/08 136/203 |
| 5,841,064 A | 11/1998 | Maekawa et al. | |
| 6,560,167 B1 * | 5/2003 | Kotanagi | G04C 10/00 136/205 |
| 7,416,512 B2 | 8/2008 | Kobayashi et al. | |
| 2005/0247337 A1 * | 11/2005 | Chen | H01J 45/00 136/205 |
| 2006/0005873 A1 * | 1/2006 | Kambe | H01L 35/30 136/211 |

(Continued)

FOREIGN PATENT DOCUMENTS

| | | |
|---|---|---|
| DE | 1216955 B | 5/1966 |
| DE | 102010050395 A1 | 5/2012 |

(Continued)

OTHER PUBLICATIONS

European Search Report for EP14151238 dated Aug. 27, 2014.

(Continued)

*Primary Examiner* — Golam Mowla
(74) *Attorney, Agent, or Firm* — Fishman Stewart PLLC

(57) ABSTRACT

A thermoelectric module may include a fluid-tight housing having at least one thermoelectrically active element arranged therein. The at least one thermoelectrically active element may have a coating. The housing may form an outer encapsulation and the coating may form an inner encapsulation for the at least one thermoelectrically active element.

18 Claims, 3 Drawing Sheets

(56) References Cited

U.S. PATENT DOCUMENTS

| | | | |
|---|---|---|---|
| 2006/0207643 A1* | 9/2006 | Weaver, Jr. | H01L 35/32 |
| | | | 136/205 |
| 2008/0163916 A1* | 7/2008 | Tsuneoka | H01L 35/32 |
| | | | 136/203 |
| 2009/0093078 A1 | 4/2009 | Moczygemba | |
| 2010/0229911 A1 | 9/2010 | Leavitt et al. | |
| 2012/0055527 A1* | 3/2012 | Zika-Beyerlein | F02G 5/02 |
| | | | 136/205 |
| 2013/0276853 A1 | 10/2013 | Eder et al. | |
| 2014/0230875 A1* | 8/2014 | Angermann | H01L 35/28 |
| | | | 136/230 |

FOREIGN PATENT DOCUMENTS

| | | |
|---|---|---|
| DE | 102011005246 A1 | 9/2012 |
| DE | 102011007395 A1 | 10/2012 |
| DE | 102012208295 A1 | 12/2012 |
| JP | H07106642 A | 4/1995 |

OTHER PUBLICATIONS

Data Sheet indicating Abstract Not Available for DE1216955B.
German Search Report for DE102013202795.0, dated Oct. 10, 2013.
English abstract for DE-102011007395.
English abstract for DE102012208295.

* cited by examiner

THERMOELECTRIC MODULE

CROSS-REFERENCE TO RELATED APPLICATIONS

This application claims priority to German Patent Application Number 10 2013 202 785.0, filed Feb. 20, 2013, the contents of which are hereby incorporated by reference in their entirety.

TECHNICAL FIELD

The present invention relates to a thermoelectric module with a fluid-tight housing according to the preamble of claim 1. In addition, the invention relates to a method for producing such a thermoelectric module.

BACKGROUND

Thermoelectric modules are used both as heating/cooling elements, for example as so-called Peltier elements, and as thermoelectric generators. The fundamental structure for both applications is the same in this case. Initially, externally an electrically non-conductive layer, e.g. made from ceramic ensures electrical insulation. Thermoelectric active elements, which are connected to electrical conductor tracks, are located in the interior of the thermoelectric module. Solder is often used as joining material between the conductor tracks and the thermoelectrically active element. The thermoelectric modules are usually connected to a ceramic side on the cold side and to the metallic side on the hot side. In order to allow a simple welding of the thermoelectric module, it is advantageous to apply the ceramic onto a metallic base material. Often, on the hot side of the thermoelectric module, the high temperature is generated by an exhaust combustion gas, which still contains oxygen and in particular also elevated levels of water, so these exhaust combustion gases act in a strongly oxidising manner. The thermoelectrically active element is changed by the oxidation, wherein gaseous, that is to say volatile, oxides can also be formed. In addition, the exhaust gas entrains hydrocarbons and carbon black, which are deposited after condensation at temperatures below the dew-point temperature as a parasitic electrically-conductive and heat-conducting layer on the thermoelectrically active element. Thus, the exhaust gas is therefore to be kept away from the thermoelectric active element for a wide range of reasons.

In addition to the risk of oxidation, certain thermoelectrically active elements, which for example contain tellurium (Te) or antimony (Sb), have a tendency towards element vaporisation. This is important in the case of Sb-base materials, such as for example $CoSb_3$ and $Zn_4Sb_3$, as these thermoelectrically active elements are intended in particular for use at elevated temperatures up to 400° C. and even beyond that.

Amorphous electrical modules for preventing the oxidation are already known, which are completely enclosed in a housing, for example made from high-grade steel, and in the case of which the interior is filled by means of an inert gas. As a result, although the oxidation can be inhibited, the previously described element vaporisation cannot. In addition, a gap is present between the metallic housing and the interior, which in turn reduces the efficiency of the thermoelectric module.

A thermoelectric module is known from U.S. Pat. No. 7,461,512 B2, the interior of which is filled between the thermoelectrically active element and a housing by means of a sol-gel. By means of thermal conversion, one obtains a coating of the thermoelectrically active element with a so-called aerogel. As the pore diameter of this aerogel is much smaller than the average free path length of the vaporised element, the element vaporisation can be reduced by a factor of 10. An aerogel of this type does not protect against an oxidation however.

A generic thermoelectric module with a fluid-tight housing, in which at least one thermoelectrically active element is arranged, is known from DE 10 2011 005 246 A1. In this case, the housing is assembled from two housing elements, namely from a metallic housing element and a further housing element, which is arranged on the side of the metallic housing element which has a ceramic layer. It is therefore suggested that an electrical insulating layer is applied on a metallic housing material and the actual conductor tracks are only applied thereupon.

A thermoelectric module is known from DE 10 2012 208 295 A1, which has a housing element and a thermoelectric element arranged on the housing element, wherein a joint seam region is provided between the thermoelectric element and the housing element, which was formed by compressing a joining material. Further, the thermoelectric module comprises a further housing element, which is connected to the housing element to form from an optionally fluid-tight housing, wherein the thermoelectric element and the joint seam region are arranged in the housing.

SUMMARY

The present invention is therefore concerned with the problem of suggesting an improved embodiment for a thermoelectric module of the generic type, which stands out in particular on account of a long service life.

This problem is solved according to the invention by means of the subjects of the independent claims. Advantageous embodiments of the invention are the subject of the dependent claims.

The present invention is based on the general idea of providing a thermoelectric module with a double encapsulation, specifically an outer encapsulation, which is essentially formed by a fluid-tight particularly metallic or ceramic housing, and an inner encapsulation, which is formed by a coating surrounding the thermoelectrically active element arranged in the fluid-tight housing. Both the risk of oxidation or coating contamination and the risk of element vaporisation of the thermoelectrically active element can be overcome, but at least reduced, due to the double encapsulation according to the invention. It is furthermore of great advantage that due to the use of the double encapsulation, both encapsulations do not necessarily have to individually be gas-tight. The outer encapsulation, that is to say the fluid-tight housing, can for example be produced by two housing parts, particularly plates, connected to one another, in particular also by two plates, which have bent edges, by means of which the two plates are joined to one another in a fluid-tight manner. The fluid-tight joining of the two housing parts can for example take place by means of welding, particularly laser welding, WIG welding, spot welding, arc welding or capacitor discharge welding, by means of soldering, for example soft soldering, hard soldering or high temperature soldering, by means of bonding, for example with silicone adhesive or inorganic adhesive based on natural silicate or by means of flanging. Whilst the welding, soldering and bonding methods allow complete fluid-tight closure, a small diffusion gap remains in the case of flanging, which however acts in the manner of a labyrinth seal for oxidative gases present externally.

A frame is expediently arranged between the two housing parts, which forms part of the housing and which is connected to the housing parts in a fluid-tight manner. The frame can in this case be constructed in two parts in particular, wherein a first frame part is connected in a fluid-tight manner to the one housing part and a second frame part is connected in a fluid-tight manner to the second housing part and wherein the butting locations of the two frame parts are likewise joined to one another in a fluid-tight manner. The frame thus consists of two halves, which are pushed together during the assembly of the thermoelectric module according to the invention. This frame can in particular be constructed at least to some extent from metal, particularly from ferritic high-grade steel, such as 1.4512 for example, from a semiconductor material or from a ceramic element. Of course, a wide range of frame constructions are conceivable here.

With respect to the second encapsulation, that is to say the coating of the thermoelectrically active element, this can preferably consist at least to some extent of a metallic and/or ceramic element, of glass or of plastic. Also, due to the presence of the outer encapsulation, the coating no longer has to be completely flawless, particularly no longer has to remain completely free of tears during operation, as the penetration of oxygen and/or water is inhibited or at least reduced considerably. Thus, a small fault tolerance is also possible, as even a defective coating for the most part prevents element vaporisation and also oxidation due to oxidative gases possibly present between the outer and inner encapsulations. Materials which allow both only a small parasitic electric current and only a small parasitic heat flow are particularly preferred as coating. Particularly suitable therefor are non-metallic coatings in particular, e.g. a glaze, an amorphous glaze-like solid based on silicon, oxygen and carbon or the application of a silicone-resin, siloxane or a siloxane-base coating, which contains pigments or fillers, such as $Al_2O_3$. Likewise particularly preferred are those coatings which can produce covalent chemical bonds with the surface of the thermoelectrically active element. As a result, a microscopic or atomic-scale gap between the coating and the thermoelectrically active element, which could constitute a path for vaporising elements in order to propagate between the thermoelectrically active element and the coating and vaporise outwards through defects in the coating, can be avoided. Of course, an inner encapsulation of the thermoelectrically active element by means of complete or partial filling of the space between coating and housing with a material afflicted by pores, such as for example an aerogel due to an inert gas, is also furthermore conceivable.

The present invention further relates to the general idea, in the case of a method for producing the thermoelectric module according to the invention, to only undertake the actual coating of the thermoelectrically active element, that is to say the inner encapsulation, after the assembly of the thermoelectric active element in the housing. As a result it is possible that coating does not impair the joining process, that is to say the assembly of the thermoelectrically active element in the housing.

Further important features and advantages of the invention result from the sub-claims, from the drawings and from the associated description of the figures on the basis of the drawings.

It is to be understood that the previously mentioned features and the features which are still to be mentioned in the following, can be used not only in the respectively specified combination, but also in other combinations or alone, without departing from the context of the present invention.

A preferred exemplary embodiment of the invention is illustrated in the drawings and is described in more detail in the following description.

DETAILED DESCRIPTION

Figure 1:
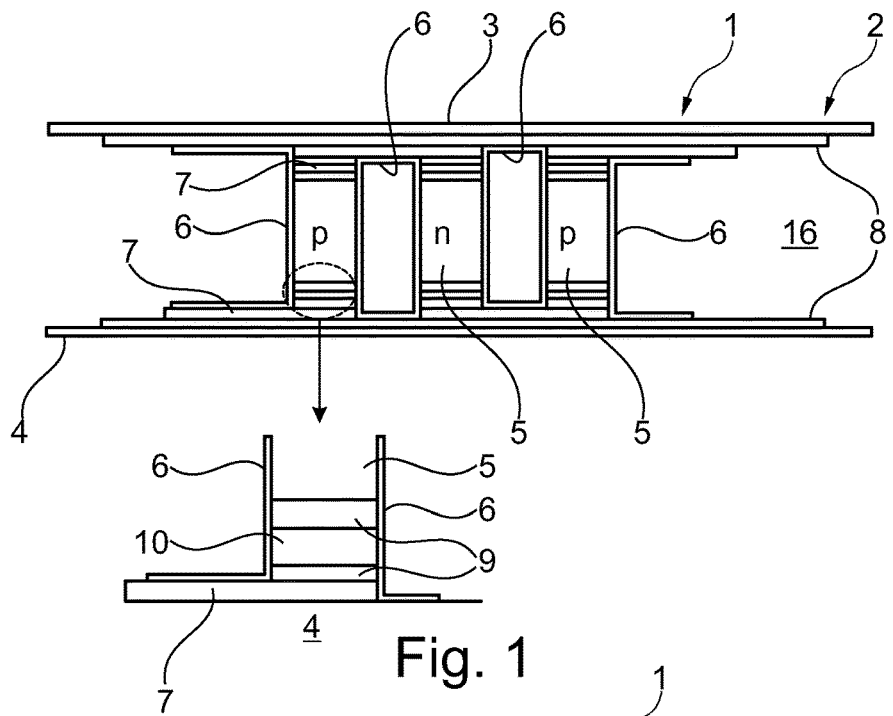
FIG. 1 shows an illustration of a cutout of a thermoelectric module according to the invention.
Figure 2:
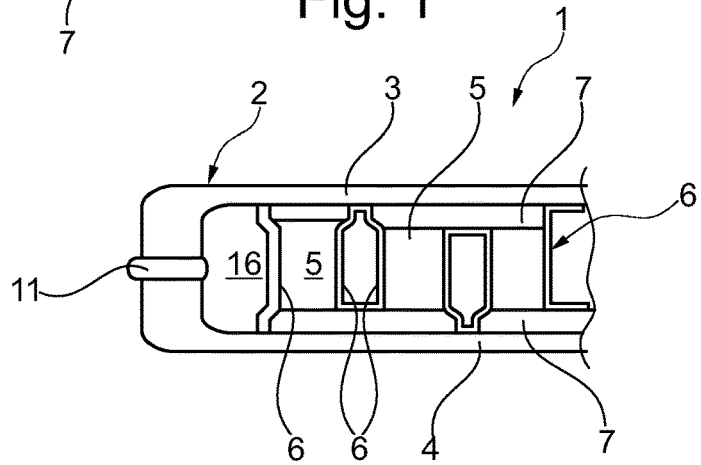
FIGS. 2 to 12 show a wide range of embodiments of the thermoelectric module according to the invention with double encapsulation.
Figure 3:
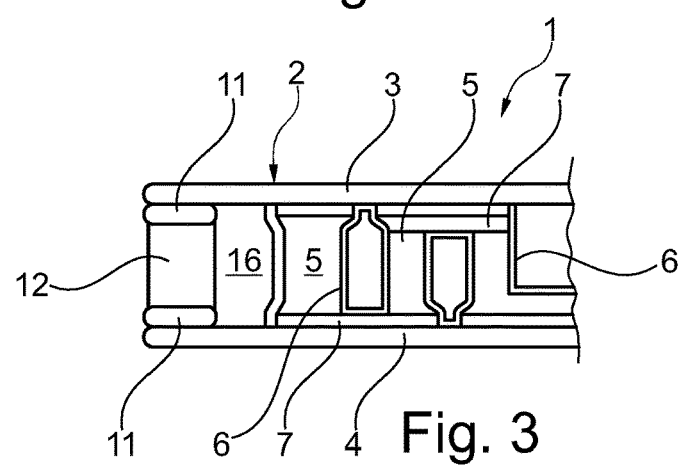

According to FIGS. 1 to 12, a thermoelectric module 1 according to the invention has a fluid-tight housing 2, which consists of at least two housing parts 3, 4, particularly plates, connected to one another in a fluid-tight manner. Arranged within the housing 2 is a thermoelectrically active element 5, which is constructed for converting thermal energy into electrical energy and can consequently function as a thermogenerator. In the supplied with electricity, it would also be purely theoretically possible to use the thermoelectrically active element 5 for cooling or for heating. In order to then be able to effectively prevent oxidation of the thermoelectrically active element 5 and also element vaporisation of the same, the thermoelectrically active element 5 is coated, that is to say provided with a coating 6, so that the housing 2 forms an outer encapsulation and the coating 6 forms an inner encapsulation. The provision according to the invention of two encapsulations in this case offers the great advantage that each encapsulation individually does not have to be 100% sealed, as a result of which slight faults or fault tolerances can be compensated.

If one considers FIG. 1, one can see that the thermoelectrically active element 5 is arranged above conductor tracks 7 on an electrical insulation 8 and is connected to the respective housing part 3, 4 by means of the same. Further layers can be provided between the thermoelectrically active element 5 and the conductor track 7, such as for example a diffusion barrier or adhesive layer 9 and also a joining material 10.

The two housing parts 3, 4 can for example be connected to one another by means of welding, particularly by means of laser welding, WIG welding, spot welding, arc welding or capacitor discharge welding, by means of soldering, soft soldering, hard soldering or high temperature soldering, by means of bonding, for example with silicone adhesive or inorganic adhesive based on natural silicate or by means of flanging. A joint seam 11, particularly a weld, bond or soldered seam, is marked in FIGS. 2 to 12,. When flanging the two housing parts 3, 4 to one another, although there is a risk of there still being a small gap between the two housing parts 3, 4, this is negligible owing to the labyrinth seal effect.

According to a preferred embodiment of the solution according to the invention, a frame 12 (cf. FIGS. 3, 4, 8 and also 11 and 12) can also be arranged between the two housing parts 3, 4, which forms a part of the housing 2 and therefore the outer encapsulation and which at the same time is connected, in particular bonded, welded or soldered, in a fluid-tight manner to the housing parts 3, 4 of the housing 2. Common to all shown variants of the thermoelectric module 1 according to the invention is the fact that the thermoelectrically active element 5 is protected from direct contact with damaging engine exhaust gases both by means of the outer encapsulation, formed by the housing 2, and by means of the inner encapsulation, formed by the coating 6. Due to the double encapsulation, the service life of the thermoelectric module 1 according to the invention can be lengthened considerably.

Figure 4:
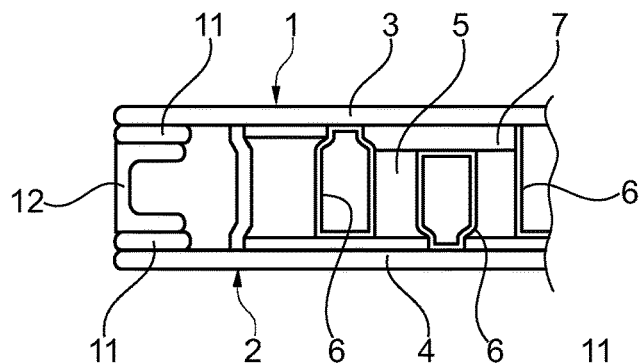
Figure 5:
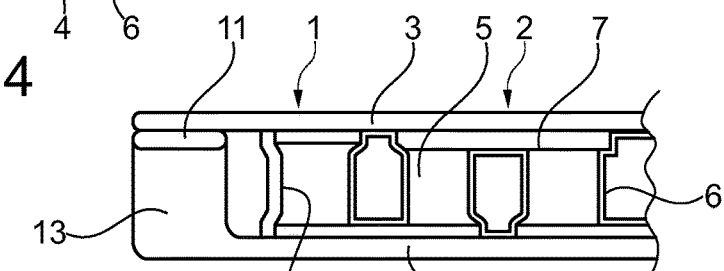
Figure 6:
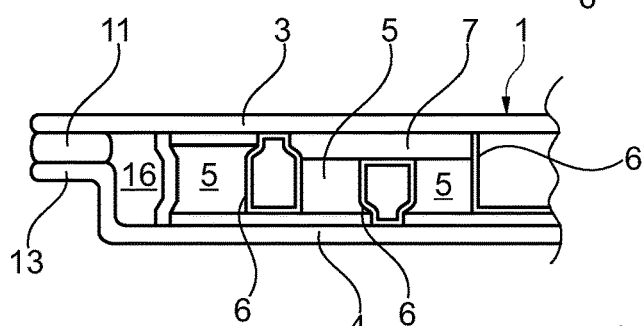
Figure 7:
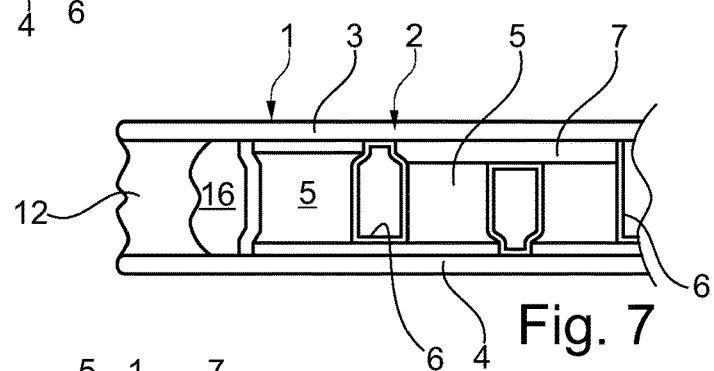
Figure 8:
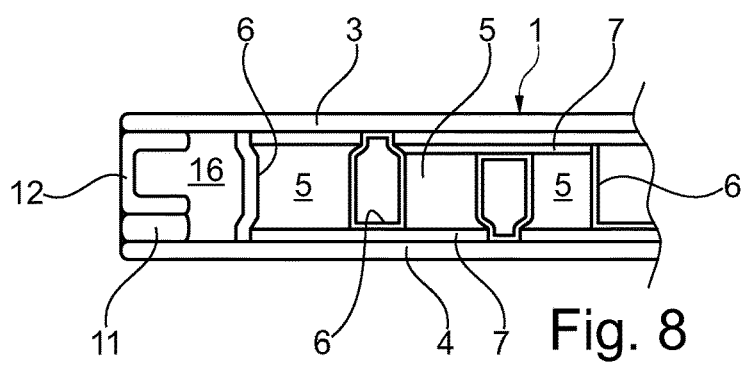

If one considers FIG. 4, then one can see that the frame 12 is for example constructed in the manner of a C profile or else that one of the two housing parts 3, 4, according to FIG. 5 the housing part 4, has a bent edge 13 which is connected via the joint seam 11 to the other housing part 3. The housing part 4 according to FIG. 6 also has an edge 13 bent in such a manner but angled differently. In FIG. 7, the joint seam 11 is comparatively thick, so that in this case the two housing parts 3, 4 are constructed flat and arranged parallel to one another. In the thermoelectric module 1 according to FIG. 8, the C-shaped frame 12 is connected directly to the housing part 3 and indirectly via the joint seam 11 to the housing part 4.

Figure 9:
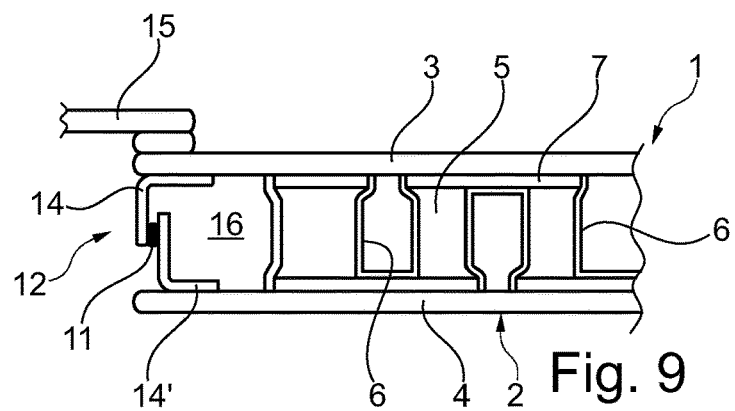

In the thermoelectric module 1 according to FIG. 9, the frame 12 has two frame parts 14, 14' in the manner of angled profiles 14, which are arranged on the respectively associated housing part 3, 4, wherein the two frame parts 14, 14' are connected to one another in a fluid-tight manner via the joint seam 11. According to FIG. 9, the frame 12 is formed from the two angled profiles 14, 14', so that in this case, the frame 12 is constructed in two parts and wherein the butting locations of the two frame parts 14, 14' are likewise joined to one another in a likewise fluid-tight manner via a corresponding joint seam 11. The frame 12 can be constructed at least to some extent from metal, particularly from ferritic high-grade steel, from a semiconductor material or else from ceramic.

Figure 10:
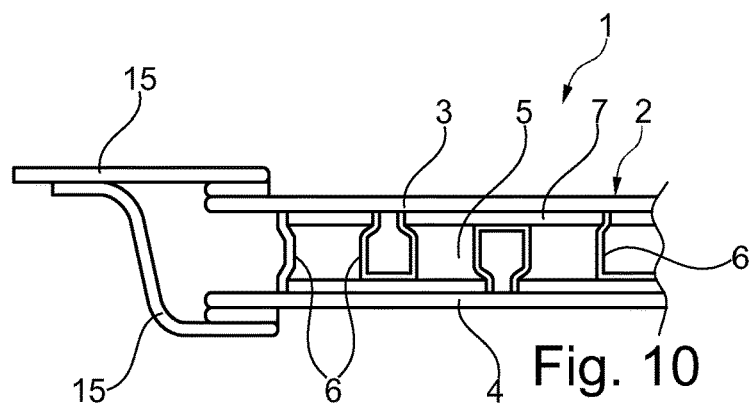
Figure 11:
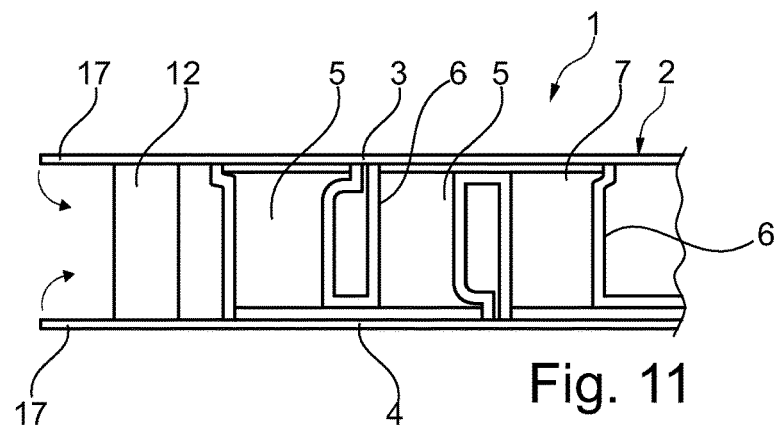
Figure 12:
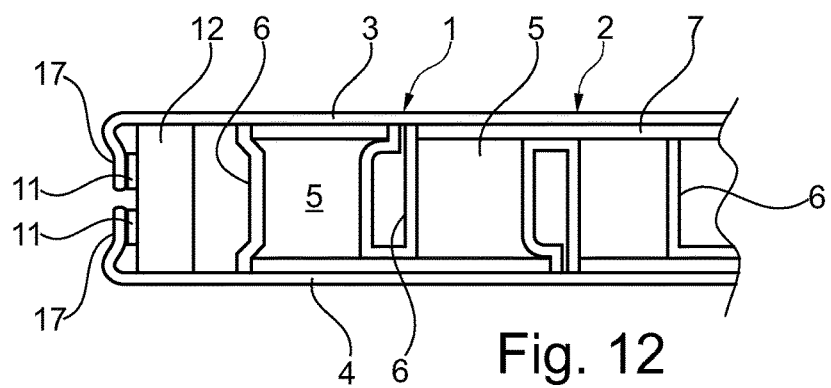

FIG. 10 shows an integration of the thermoelectric module 1 according to the invention into a holder 15, wherein the thermoelectric module 1 can be installed via this housing 15 into a heat exchanger, which is not shown, so that the thermoelectric module 1 can be called upon for cooling a coolant for example by means of electrical energy extraction. FIGS. 11 and 12 further show the connection of the two housing parts 3, 4 to the frame 12, wherein protruding end regions 17 of the housing parts 3, 4 according to FIG. 11 are bent and subsequently connected via a joint seam 11 to the frame 12.

The coating 6 consists at least to some extent of a metallic and/or ceramic material, of glass or of plastic, wherein the coating 6 in particular consists of an amorphous glass-like solid based on silicon, oxygen and carbon, of a silicone resin, a siloxane or a siloxane base with pigments and fillers, such as for example $Al_2O_3$. Furthermore, the coating 6 is particularly preferably bonded via covalent chemical bonds to the thermoelectric active element 5. In order to be able to further minimise the oxidation risk in particular, a space 16 between the coating 6 and the housing 2 can be filled at least to some extent, particularly filled with an aerogel or an inert gas. An aerogel or inert gas of this type prevents or at least reduces the oxidation.

In order to be able to apply the coating 6 as flawlessly as possible, and in particular also to not negatively influence a joining process, the coating 6 is preferably only applied when the thermoelectric active element 5 is already connected to the housing 2. In this case, the coating 6 also covers the exposed locations of the conductor tracks 7 (cf. FIGS. 2 to 8), wherein it is also conceivable that the thermoelectrically active elements 5 are coated before installation into the housing 2 (cf. FIGS. 9 to 12), so that in these cases, the conductor tracks 7 are exposed to some extent.

Using the thermoelectric module 1 according to the invention, it is thus possible to effectively keep engine exhaust gases away from the thermoelectrically active element 5 and as a result to reduce both the risk of oxidation and the risk of element vaporisation considerably. Due to the reduction of the risks mentioned, the service life of the thermoelectric module 1 according to the invention can be increased.

The invention claimed is:

1. A thermoelectric module, comprising:
a fluid-tight housing enclosing an interior;
at least one thermoelectrically active element arranged in the interior of the housing;
a coating surrounding the at least one thermoelectrically active element;
an electrical insulation layer arranged in the interior between the housing and the at least one thermoelectrically active element;
an electrical conductor track arranged between the electrical insulation layer and the at least one thermoelectrically active element;
at least one further material layer disposed between the electrical conductor track and the at least one thermoelectrically active element;
the housing including a first housing part and a second housing part connected to one another along a fluid-tight joint, the first housing part including a bent edge extending transversely from the first housing part towards the second housing part and a flanged edge structured and arranged to connect the bent edge of the first housing part to the second housing part at the fluid-tight joint, wherein the flanged edge projects outwardly from the bent edge away from the interior at the fluid-tight joint;
wherein the housing defines an outer encapsulation and the coating defines an inner encapsulation for the at least one thermoelectrically active element;
wherein the at least one further material layer is a diffusion barrier layer or an adhesive layer and the coating covers exposed regions of the electrical conductor track and the at least one further material layer; and
wherein the coating is composed of a material including at least one of a metal, a ceramic, and a glass.

2. The thermoelectric module according to claim 1, wherein the flanged edge is connected to the second housing part via a joint seam at the fluid-tight joint.

3. The thermoelectric module according to claim 2, wherein the joint seam includes at least one of a welded connection, a soldered connection, and a bonded connection.

4. The thermoelectric module according to claim 1, wherein the material of the coating is an amorphous solid based on silicon (Si), oxygen (O), and carbon (C).

5. The thermoelectric module according to claim 1, wherein the material of the coating is a silicone resin, a siloxane or a siloxane base, and wherein the silicone resin, the siloxane or the siloxane base contains $Al_2O_3$.

6. The thermoelectric module according to claim 1, further comprising a space arranged in the interior between the coating and the housing filled at least in part with at least one of an aerogel and an inert gas.

7. The thermoelectric module according to claim 1, wherein the coating substantially completely seals around the at least one thermoelectrically active element, apart from incidental flaws.

8. The thermoelectric module according to claim 1, wherein the at least one further material layer includes at least two further material layers and a joining material sandwiched between the at least two further material layers.

9. The thermoelectric module according to claim 1, wherein the bent edge and the flanged edge of the first housing part extend transversely to one another.

10. The thermoelectric module according to claim 1, wherein the electrical insulation layer and the electrical conductor track are arranged between the at least one thermoelectrically active element and the first housing part;
further including a second electrical insulation layer arranged in the interior between the at least one thermoelectrically active element and the second housing part; and
another electrical conductor track arranged between the second electrical insulation layer and the at least one thermoelectrically active element.

11. A thermoelectric module, comprising:
an outer encapsulation;
an inner encapsulation contained within the outer encapsulation;
at least one thermoelectrically active element encapsulated by the outer encapsulation and the inner encapsulation, wherein the inner encapsulation substantially completely surrounds the at least one thermoelectrically active element apart from incidental defects;
the outer encapsulation including a fluid-tight housing enclosing an interior, the fluid-tight housing including a first housing part and a second housing part connected to one another at a fluid-tight joint;
the inner encapsulation including a coating material sealing around the at least one thermoelectrically active element, wherein the coating material is at least partially bonded to the at least one thermoelectrically active element;
wherein the inner encapsulation and the at least one thermoelectrically active element are arranged in the interior of the fluid-tight housing, and the at least one thermoelectrically active element is sandwiched between the first housing part and the second housing part; and
wherein the first housing part has a bent edge extending transversely from the first housing part towards the second housing part and a flanged edge projecting outwardly from the bent edge away from the interior at the fluid-tight joint, and wherein the fluid-tight joint is defined by a flanged connection where the flanged edge is structured and arranged to connect the bent edge of the first housing part to the second housing part via a joint seam.

12. The thermoelectric module according to claim 11, wherein a space is disposed in the interior between the housing and the coating material, and wherein the space is at least partially filled with an aerogel.

13. The thermoelectric module according to claim 11, wherein the joint seam is a weld seam, an adhesive bond or a soldered seam.

14. The thermoelectric module according to claim 11, wherein the coating material is composed of a silicone resin, a siloxane, or a siloxane base where the silicone resin, the siloxane or the siloxane base is provided with at least one of pigments and fillers including $Al_2O_3$.

15. The thermoelectric module according to claim 11, wherein the first housing part comprises a plate where the bent edge is structured and arranged to extend transversely from the plate of the first housing part towards the second housing part at the fluid-tight joint, and wherein the flanged edge is arranged at an end of the bent edge disposed away from the plate of the first housing part.

16. The thermoelectric module according to claim 15, wherein the second housing part is structured as a flat plate disposed opposite to the plate of the first housing part with respect to the at least one thermoelectrically active element, and wherein the flanged edge of the first housing part extends transversely from the bent edge and parallel to the flat plate of the second housing part such that the joint seam is disposed between the flanged edge of the first housing part and the flat plate of the second housing part.

17. The thermoelectric module according to claim 11, wherein the coating material is composed of an amorphous glass-like solid based on silicon (Si), oxygen (O), and carbon (C).

18. The thermoelectric module according to claim 1, wherein the first housing part is structured as a plate having the bent edge and the second housing part is structured as a flat plate disposed opposite to the plate of the first housing part with respect to the at least one thermoelectrically active element, and wherein the flanged edge extends transversely from the bent edge and parallel to the flat plate of the second housing part at the fluid-tight joint.

* * * * *